United States Patent
Sadaka et al.

(10) Patent No.: US 9,041,214 B2
(45) Date of Patent: May 26, 2015

(54) BONDED PROCESSED SEMICONDUCTOR STRUCTURES AND CARRIERS

(71) Applicant: Soitec, Bernin (FR)

(72) Inventors: Mariam Sadaka, Austin, TX (US); Ionut Radu, Crolles (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 13/900,157

(22) Filed: May 22, 2013

(65) Prior Publication Data

US 2013/0256907 A1    Oct. 3, 2013

Related U.S. Application Data

(62) Division of application No. 12/839,203, filed on Jul. 19, 2010, now Pat. No. 8,461,017.

(51) Int. Cl.
*H01L 23/52*    (2006.01)
*H01L 21/20*    (2006.01)
(Continued)

(52) U.S. Cl.
CPC .......... *H01L 23/562* (2013.01); *H01L 21/2007* (2013.01); *H01L 21/6835* (2013.01); *H01L 21/76898* (2013.01); *H01L 23/5384* (2013.01); *H01L 24/03* (2013.01); *H01L 24/05* (2013.01); *H01L 24/08* (2013.01); *H01L 24/27* (2013.01); *H01L 24/29* (2013.01); *H01L 24/32* (2013.01); *H01L 24/80* (2013.01); *H01L 24/83* (2013.01); *H01L 24/92* (2013.01); *H01L 24/94* (2013.01); *H01L 25/50* (2013.01); *H01L 2221/68327* (2013.01); *H01L 2221/68363* (2013.01); *H01L 2221/68377* (2013.01); *H01L 2221/68381* (2013.01); *H01L 2224/03616* (2013.01); *H01L 2224/0362* (2013.01); *H01L 2224/04026* (2013.01); *H01L 2224/05009* (2013.01); *H01L 2224/056* (2013.01);
(Continued)

(58) Field of Classification Search
USPC .................. 257/774, 686, 202, 786
See application file for complete search history.

(56) References Cited

U.S. PATENT DOCUMENTS 5,374,564 A    12/1994    Bruel
5,993,677 A    11/1999    Biasse et al.
(Continued)

FOREIGN PATENT DOCUMENTS

CN    1492481 A    4/2004
CN    1672261 A    9/2005
(Continued)

OTHER PUBLICATIONS

Taiwanese Search Report for Taiwan Application No. 100121500 dated Jul. 23, 2013, 1 page.
(Continued)

*Primary Examiner* — Thanh Nguyen

(74) *Attorney, Agent, or Firm* — TraskBritt

(57) ABSTRACT

Methods of fabricating semiconductor structures include implanting atom species into a carrier die or wafer to form a weakened region within the carrier die or wafer, and bonding the carrier die or wafer to a semiconductor structure. The semiconductor structure may be processed while using the carrier die or wafer to handle the semiconductor structure. The semiconductor structure may be bonded to another semiconductor structure, and the carrier die or wafer may be divided along the weakened region therein. Bonded semiconductor structures are fabricated using such methods.

20 Claims, 4 Drawing Sheets

(51) Int. Cl.
*H01L 21/683* (2006.01)
*H01L 21/768* (2006.01)
*H01L 23/538* (2006.01)
*H01L 23/00* (2006.01)
*H01L 25/00* (2006.01)

(52) U.S. Cl.
CPC ............. *H01L 2224/05647* (2013.01); *H01L 2224/05687* (2013.01); *H01L 2224/08146* (2013.01); *H01L 2224/0903* (2013.01); *H01L 2224/16145* (2013.01); *H01L 2224/27444* (2013.01); *H01L 2224/27616* (2013.01); *H01L 2224/29187* (2013.01); *H01L 2224/32145* (2013.01); *H01L 2224/73204* (2013.01); *H01L 2224/80* (2013.01); *H01L 2224/80006* (2013.01); *H01L 2224/80011* (2013.01); *H01L 2224/80121* (2013.01); *H01L 2224/802* (2013.01); *H01L 2224/80203* (2013.01); *H01L 2224/80357* (2013.01); *H01L 2224/80805* (2013.01); *H01L 2224/80895* (2013.01); *H01L 2224/80896* (2013.01); *H01L 2224/80905* (2013.01); *H01L 2224/83* (2013.01); *H01L 2224/83005* (2013.01); *H01L 2224/83011* (2013.01); *H01L 2224/83022* (2013.01); *H01L 2224/83121* (2013.01); *H01L 2224/83191* (2013.01); *H01L 2224/83193* (2013.01); *H01L 2224/832* (2013.01); *H01L 2224/83203* (2013.01); *H01L 2224/83805* (2013.01); *H01L 2224/83896* (2013.01); *H01L 2224/92* (2013.01); *H01L 2224/9211* (2013.01); *H01L 2224/94* (2013.01); *H01L 2225/06513* (2013.01); *H01L 2225/06541* (2013.01); *H01L 2924/00* (2013.01); *H01L 2924/00014* (2013.01); *H01L 2924/01005* (2013.01); *H01L 2924/01006* (2013.01); *H01L 2924/01013* (2013.01); *H01L 2924/01019* (2013.01); *H01L 2924/01023* (2013.01); *H01L 2924/01029* (2013.01); *H01L 2924/01033* (2013.01); *H01L 2924/01051* (2013.01); *H01L 2924/01074* (2013.01); *H01L 2924/01079* (2013.01); *H01L 2924/01322* (2013.01); *H01L 2924/05042* (2013.01); *H01L 2924/05442* (2013.01); *H01L 2924/10253* (2013.01); *H01L 2924/1301* (2013.01); *H01L 2924/1305* (2013.01); *H01L 2924/3512* (2013.01)

(56) References Cited

U.S. PATENT DOCUMENTS

| | | | |
|---|---|---|---|
| 6,303,468 B1 | 10/2001 | Aspar et al. | |
| 6,335,258 B1 | 1/2002 | Aspar et al. | |
| 6,548,391 B1 | 4/2003 | Ramm et al. | |
| 6,756,286 B1 | 6/2004 | Moriceau et al. | |
| 6,809,044 B1 | 10/2004 | Aspar et al. | |
| 6,946,365 B2 | 9/2005 | Aspar et al. | |
| RE39,484 E | 2/2007 | Bruel | |
| 7,205,211 B2 | 4/2007 | Aspar et al. | |
| 7,320,929 B2 | 1/2008 | Aga et al. | |
| 7,508,034 B2 | 3/2009 | Takafuji et al. | |
| 2004/0061176 A1 | 4/2004 | Takafuji et al. | |
| 2004/0157407 A1 | 8/2004 | Tong et al. | |
| 2004/0219765 A1 | 11/2004 | Reif et al. | |
| 2006/0040469 A1 | 2/2006 | Aga | |
| 2006/0121690 A1 | 6/2006 | Pogge et al. | |
| 2009/0057890 A1 | 3/2009 | Maebashi et al. | |
| 2009/0174018 A1 | 7/2009 | Dungan et al. | |
| 2010/0068868 A1 | 3/2010 | Kim et al. | |
| 2010/0230724 A1* | 9/2010 | Sinha et al. | 257/202 |
| 2011/0117708 A1* | 5/2011 | Shimomura et al. | 438/164 |
| 2012/0013013 A1 | 1/2012 | Sadaka et al. | |

FOREIGN PATENT DOCUMENTS

| | | |
|---|---|---|
| CN | 101197297 A | 6/2008 |
| EP | 0533551 A1 | 3/1993 |
| KR | 20050025591 | 3/2005 |
| KR | 100621960 | 9/2006 |

OTHER PUBLICATIONS

Daggubati, Manmohan, et al., Dependence of the Fracture of PowerTrench MOSFET Device on its Topography in Cu Bonding Process, IEEE Transactions on Components and Packaging Technologies, Mar. 2009, pp. 73-78, vol. 32, No. 1.

Du, Jiangang et al., SinglF10/0314 MSA GLAe Crystal Silicon MEMS Fabrications Based on Smart-Cut Technique, Sensors and Actuators A, 2004, pp. 116-121, vol. 112.

Deptuch, Grzegorz, et al., Vertical Integration of Integrated Circuits and Pixel Detectors, Femilab, VERTEX Aug. 28, 2007-Jan. 8, 2008.

French Preliminary Search Report for French Application No. 1056122 dated Mar. 29, 2011, 5 pages.

French Written Opinion for French Application No. 1056122 dated Mar. 29, 2011, 7 pages.

Hungarian Search Report for Singapore Application No. 201104206-6 dated Feb. 2, 2012, 6 pages.

Hungarian Written Opinion for Singapore Application No. 201104206-6 dated Feb. 2, 2012, 8 pages.

Koester et al., Wafer-Level 3D Integration Technology, Nov. 2008 IBM Journal of Research and Development, vol. 52, No. 6, Nov. 2008, pp. 583-597.

Korean Office Action for Korean Application No. 10-2011-0058448 dated Jul. 16, 2012, 3 pages.

Korean Office Action for Korean Application No. 10-2011-0058448 dated Jan. 8, 2013, 4 pages.

Reif, Rafael, et al., 3-D Interconnects Using Cu Wafer Bonding : Technology and Applications, Proceedings of the Advanced Metallization Conference, San Diego, CA, Oct. 1-3, 2002, pp. 37-45.

Tan et al., 3-D Interconnects Using Cu Wafer Bonding: Technology and Applications, NSF/SRC ERC for Environmentally Benign Semiconductor Manufacturing Annual Retreat and Semi-Annual Industrial Advisory Board Meeting, Aug. 21-22, 2003, Stanford University.

Chinese Office Action and Search Report for Chinese Application No. 201110201962.X dated Aug. 22, 2013, 7 pages.

\* cited by examiner

BONDED PROCESSED SEMICONDUCTOR STRUCTURES AND CARRIERS

CROSS-REFERENCE TO RELATED APPLICATION

This application is a divisional of U.S. patent application Ser. No. 12/839,203, filed Jul. 19, 2010, now U.S. Pat. No. 8,461,017, issued Jun. 11, 2013, the disclosure of which is hereby incorporated herein by this reference in its entirety.

TECHNICAL FIELD

The present invention generally relates to temporary semiconductor die and/or wafer bonding methods useful in forming three-dimensional semiconductor structures, to intermediate structures formed using the temporary semiconductor die and/or wafer bonding methods, and to semiconductor dice and/or wafers including an ion implanted zone for use in temporary semiconductor wafer bonding methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou, et al. "The Handbook of 3D Integration," Wiley-VCH (2008).

The 3D integration of semiconductor structures may take place by the attachment of a semiconductor die to one or more additional semiconductor dies (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

Several process sequences have been developed to facilitate the formation of 3D integrated semiconductor structures, including, for example, electrical connection between individual semiconductor structures, thinning of one or more of the semiconductor structures and alignment and bonding of individual semiconductor structures, etc. In particular, thinning of the one or more semiconductor structures comprising the 3D integrated semiconductor structure may be employed for a number of reasons, including, for example, improved heat dissipation and reduction of electrical resistance. However, the benefits that may be produced by thinning of the one or more semiconductor structures comprising the 3D integrated semiconductor structure may also introduce process complications, for example, a semiconductor structure may become relatively brittle due to a thinning process and may, thus, be susceptible to cracking, fracture or other damage during processing using existing equipment and materials.

One proposed solution to this problem is to bind the semiconductor structure, e.g., such as a semiconductor wafer, to a reinforcing substrate, such as another wafer (e.g., a carrier wafer) to provide mechanical strength during processing (e.g., thinning) of the semiconductor wafer. The process of bonding the semiconductor wafer to the reinforcing substrate is often referred to as "wafer bonding." After processing the semiconductor wafer, the reinforcing substrate may be released from the semiconductor.

For example, a semiconductor wafer may be temporarily bonded to a reinforcing substrate using an adhesive material. The adhesive material bears the force associated with holding the semiconductor wafer and the reinforcing substrate together during processing of the semiconductor wafer. Furthermore, the adhesive material and the reinforcing substrate may function as a mechanical support to provide structural stability to the semiconductor wafer during processing of the semiconductor wafer. Many spin-coated amorphous polymers, such as polyimides, benzocyclobutene (BCB), NAFION® and photoresist materials have been used as adhesive materials for wafer bonding.

Adhesive materials may be unstable at increased temperatures, however, which may limit the temperatures at which semiconductor device fabrication may be conducted. Furthermore, solvent or solvent vapors may be released from such adhesive materials at elevated temperatures. This process is often referred to as "outgassing." Outgassing may result in the formation of bubbles or voids in the adhesive material. Such bubbles or voids may result in non-uniform bonding strength between the semiconductor wafer and the reinforcing substrate, and may compromise the integrity of the bond. The adhesive material is completely removed after semiconductor wafer processing using a chemical removal process (e.g., dissolving in a solvent). The chemical removal process may be time-consuming and damaging to semiconductor devices and integrated circuit devices formed on the semiconductor wafer. Thus, adhesive bonding may be problematic when used in temporarily bonding a semiconductor wafer to a reinforcing substrate.

Another method of providing support for a semiconductor wafer during processing involves directly bonding two semiconductor substrates using a so called "direct" wafer bonding process. Direct wafer bonding processes are conventionally used in forming semiconductor-on-insulator (SeOI) structures (e.g., silicon-on-insulator (SOI) structures) that are of interest for fabrication of advanced ICs for three-dimensional (3D) device integration. In a conventional direct wafer bonding process a surface oxide layer may be formed over at least one of the wafers. The surface oxide layer may then be bonded to a silicon material or another oxide material on a surface of the other wafer. For example, a surface of an oxide material on a semiconductor wafer may be contacted with a surface of a reinforcing substrate and the two structures may be bonded together via atomic and/or molecular adhesion. To achieve a bond between two semiconductor wafers, the semiconductor wafers should have low surface roughness compatible surface chemistries (i.e., hydrophilicity and hydrophobicity), and should be at least substantially free of dust and other debris.

BRIEF SUMMARY

In some embodiments, the present disclosure includes methods of fabricating semiconductor structures. A first semiconductor structure is formed that includes at least a portion of an integrated circuit on a first substrate. Ions are implanted into a carrier wafer to form a weakened region within the carrier wafer. The carrier wafer is directly bonded to a first side of the first semiconductor structure. The first semiconductor structure is processed while the carrier wafer is attached to the first semiconductor, and the carrier wafer is used to handle the first semiconductor structure. A second semiconductor structure that includes at least a portion of an integrated circuit is directly bonded to a second side of the first semiconductor structure opposite the first side of the semiconductor structure to which the carrier wafer is directly bonded. A layer of material from the carrier wafer is separated from a remaining portion of the carrier wafer along the weakened region therein.

The present invention also includes additional embodiments of methods of fabricating semiconductor structures. Ions are implanted into a first semiconductor structure to form a weakened region therein, and a surface of the first semiconductor structure is directly bonded to a surface of a second semiconductor structure to form a bonded semiconductor structure that includes the first semiconductor structure and the second semiconductor structure. The bonded semiconductor structure is handled using the first semiconductor structure while removing a portion of the second semiconductor structure and exposing at least one conductive structure extending at least partially through the second semiconductor structure. The at least one conductive structure exposed through the second semiconductor structure is aligned with at least one conductive structure of a third semiconductor structure. The bonded semiconductor structure and the third semiconductor structure are heated, and the at least one conductive structure exposed through the second semiconductor structure is directly bonded to the at least one conductive structure of the third semiconductor structure in response to heating the bonded semiconductor structure and the third semiconductor structure. The first semiconductor structure also may be divided along the weakened region in response to heating the bonded semiconductor structure and the third semiconductor structure and leaving a portion of the first semiconductor structure on the second semiconductor structure.

Additional embodiments of the invention include bonded semiconductor structures formed during methods of fabricating semiconductor structures as described herein. For example, a bonded semiconductor structure may include a plurality of bonded processed semiconductor structures, and a carrier die or wafer bonded to at least one processed semiconductor structure of the plurality of bonded processed semiconductor structures. The carrier die or wafer may have a weakened zone comprising a plurality of implanted ions therein at an average depth of between 10 nm and 1000 nm from a surface of the carrier die or wafer bonded to the at least one processed semiconductor structure of the plurality of bonded processed semiconductor structures.

BRIEF DESCRIPTION OF THE SEVERAL VIEWS OF THE DRAWINGS

While the specification concludes with claims particularly pointing out and distinctly claiming what are regarded as embodiments of the invention, the advantages of embodiments of the invention may be more readily ascertained from the description of certain examples of embodiments of the invention when read in conjunction with the accompanying drawings, in which:

DETAILED DESCRIPTION

Figure 1:
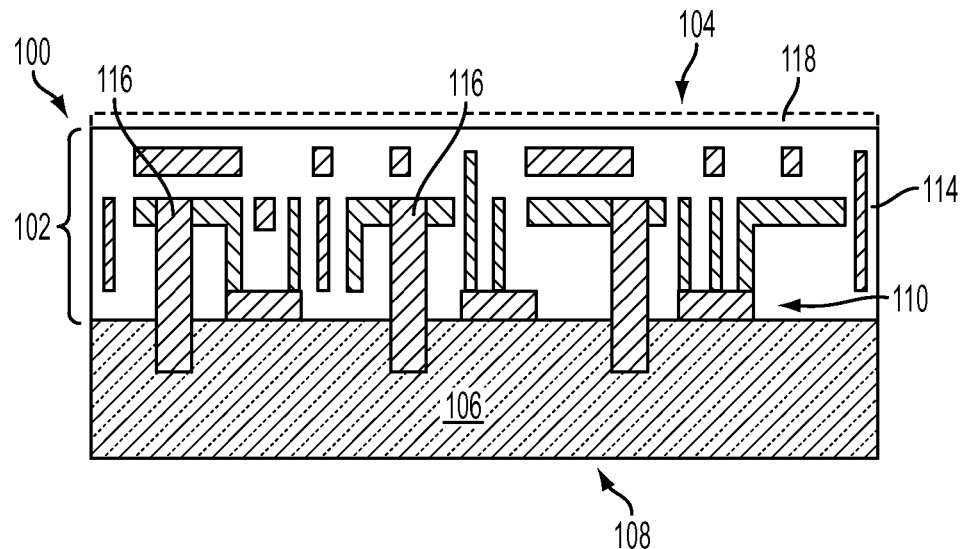
FIG. 1 is a schematic cross-sectional view of a processed semiconductor structure that includes through wafer interconnects.

The following description provides specific details, such as material types and processing conditions, in order to provide a thorough description of embodiments of the present disclosure and implementation thereof. However, a person of ordinary skill in the art will understand that the embodiments of the present disclosure may be practiced without employing these specific details and in conjunction with conventional fabrication techniques. In addition, the description provided herein does not form a complete process flow for manufacturing a semiconductor device or system. Only those process acts and structures necessary to understand the embodiments of the present invention are described in detail herein. The materials described herein may be formed (e.g., deposited or grown) by any suitable technique including, but not limited to, spin coating, blanket coating, Bridgman and Czochralski processes, chemical vapor deposition ("CVD"), plasma enhanced chemical vapor deposition ("PECVD"), atomic layer deposition ("ALD"), plasma enhanced ALD, or physical vapor deposition ("PVD"). While the materials described and illustrated herein may be formed as layers, the materials are not limited to layers and may be formed in other three-dimensional configurations.

The terms "horizontal" and "vertical," as used herein, define relative positions of elements or structures with respect to a major plane or surface of a wafer or substrate, regardless of the orientation of the wafer or substrate, and are orthogonal dimensions interpreted with respect to the orientation of the structure being described, as illustrated in the drawing being referred to when the structure is being described. As used herein, the term "vertical" means and includes a dimension substantially perpendicular to the major surface of a substrate or wafer as illustrated, and the term "horizontal" means a dimension substantially parallel to the major surface of the substrate or wafer as illustrated and extending between left and right sides of the drawing. Prepositions, such as "on," "over," "above" and "under," as used herein, are relative terms corresponding to the vertical direction with respect to the structure being described.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices. Semiconductor structures may comprise conductive, semiconductive materials, and/or non-conductive materials.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures. Furthermore, bonded semiconductor structures that include one or more processed semiconductor structures are also processed semiconductor structures.

As used herein, the term "device structure" means and includes any portion of a processed semiconductor structure that is, includes, or defines at least a portion of an active or passive component of a semiconductor device to be formed on or in the semiconductor structure. For example, device structures include active and passive components of integrated circuits such as, for example, transistors, transducers, capacitors, resistors, conductive lines, conductive vias, and conductive contact pads.

As used herein, the term "through wafer interconnect" or "TWI" means and includes any conductive via extending through at least a portion of a first semiconductor structure that is used to provide a structural and/or an electrical interconnection between the first semiconductor structure and a second semiconductor structure across an interface between the first semiconductor structure and the second semiconductor structure. Through wafer interconnects are also referred to in the art by other terms such as "through silicon vias" or "through substrate vias" (TSVs) and "through wafer vias" or "TWVs." TWIs typically extend through a semiconductor structure in a direction generally perpendicular to the generally flat, major surfaces of the semiconductor structure (i.e., in a direction parallel to the "Z" axis).

As used herein, the term "active surface," when used in relation to a processed semiconductor structure, means and includes an exposed major surface of the processed semiconductor structure that has been, or will be, processed to form one or more device structures in and/or on the exposed major surface of the processed semiconductor structure.

As used herein, the term "back surface," when used in relation to a processed semiconductor structure, means and includes an exposed major surface of the processed semiconductor structure on an opposing side of the processed semiconductor structure from an active surface of the semiconductor structure.

As used herein, the term "III-V type semiconductor material" means and includes any material predominantly comprised of one or more elements from group IIIA of the periodic table (B, Al, Ga, In, and Ti) and one or more elements from group VA of the periodic table (N, P, As, Sb, and Bi).

Referring to FIG. 1, a processed semiconductor structure 100 is shown that includes a device region 102 that may extend into substrate 106 and on and/or over a surface of a substrate 106. The processed semiconductor structure 100 includes an active surface 104 and an opposite back surface 108. The active surface 104 comprises an exposed major surface of the device region 102 of the processed semiconductor structure 100, while the back surface 108 comprises an exposed major surface of the substrate 106. The substrate 106 may comprise, for example, a semiconductor material such as silicon (Si), germanium (Ge), a III-V semiconductor material, etc. Furthermore, the substrate 106 may comprise a single crystal of semiconductor material, or one or more epitaxial layers of semiconductor material upon a base substrate. In additional embodiments, the substrate 106 may comprise one or more dielectric materials such as an oxide (e.g., silicon dioxide ($SiO_2$) or aluminum oxide ($Al_2O_3$)), a nitride (e.g., silicon nitride ($Si_3N_4$), boron nitride (BN) or aluminum Nitride (AlN)), etc.

The substrate 106 may be selected to have desirable properties for use in a direct wafer bonding process, as will be described in further detail. For example, the substrate 106 may include a silicon wafer having a low bow, warp and total thickness variation (TTV). As used herein, the term "bow" means and includes a measure of concavity, curvature or deformation of a median surface of a semiconductor substrate at a centerline independent of any thickness variations. As used herein, the term "warp" means and includes a difference between a maximum deviation and a minimum deviation of the median surface relative to a backside reference plane of a semiconductor substrate. As used herein, the terms "total thickness variation" and "TTV" each mean and include a maximum variation in thickness of a semiconductor substrate and is generally defined as a difference between a minimum thickness and maximum thickness measured on the semiconductor substrate. For example, the total thickness variation of a semiconductor substrate may be determined by measuring the semiconductor substrate in five (5) or more locations in a cross pattern on the semiconductor substrate and calculating a maximum measured difference in thickness.

Semiconductor substrates with high warp, bow and total thickness variation may be undesirable for use in direct wafer bonding processes for several reasons. For example, during direct wafer bonding processes, high warp, bow and total thickness variation levels may result in uneven contact between the semiconductor substrates being bonded. Such uneven contact may result in thermal variations and disruptions in molecular adhesion during the direct wafer bonding process. Furthermore, high warp and bow values may increase the risk of the semiconductor substrate cracking during the device fabrication due to stresses induced as the wafer is adhered to a vacuum chuck. Accordingly, a silicon wafer having a low warp, bow and total thickness variation may be used as the substrate 106 to provide sufficient uniformity and flatness for the wafer bonding process. As a non-limiting example, the substrate 106 may be a high quality silicon wafer having a warp of less than about thirty micrometers (30 μm), a bow of less than about ten micrometers (10 μm) and a total thickness variation of less than about one micrometer (1 μm).

The device region 102 may include, for example, one or more device structures 110, which may include conductive and/or semiconductive elements embedded in dielectric material 114. The device structures 110 may include metal oxide semiconductor (MOS) transistors, bipolar transistors, field effect transistors (FETs), diodes, resistors, thyristors, rectifiers, and the like. The device structures 110 also may comprise conductive lines, traces, vias, and pads that may be formed from, for example, one or more metals such as copper (Cu), aluminum (Al) or tungsten (W). The device structures 110 also may comprise one or more through wafer interconnects 116. The through wafer interconnects 116 may be formed by depositing a conductive material, such as copper (Cu), aluminum (Al), tungsten (W), polycrystalline silicon, or gold (Au), in a via hole. For example, the through wafer interconnects 116 may extend from another device structure 110 and through at least a portion of the dielectric material 114. The through wafer interconnects 116 also may extend partially through the substrate 106.

After forming the device region 102, a bonding material 118, shown in broken lines, may optionally be formed over a major surface of the processed semiconductor structure 100. The bonding material 118 may be formed from a material that exhibits good adhesion with another material in a direct bonding process. For example, the bonding material 118 may comprise a dielectric material such as an oxide (e.g., silicon dioxide ($SiO_2$)), an oxynitride (e.g., silicon oxynitride (SiON)), or a nitride (e.g., silicon nitride ($Si_3N_4$)). The bonding material 118 may have a thickness of, for example, between about one hundred nanometers (100 nm) and about two micrometers (2 μm). The bonding material 118 may be deposited over an active surface 104 on the device region 102 using, for example, chemical vapor deposition (CVD), physical vapor deposition (PVD), atomic layer deposition (ALD), or plasma enhanced chemical vapor deposition (PECVD). The bonding material 118 may be planarized, for example, to reduce surface topography of the bonding material 118. The bonding material 118 may be planarized utilizing, for example, one or more of etching, grinding and chemical mechanical polishing.

Figure 2:
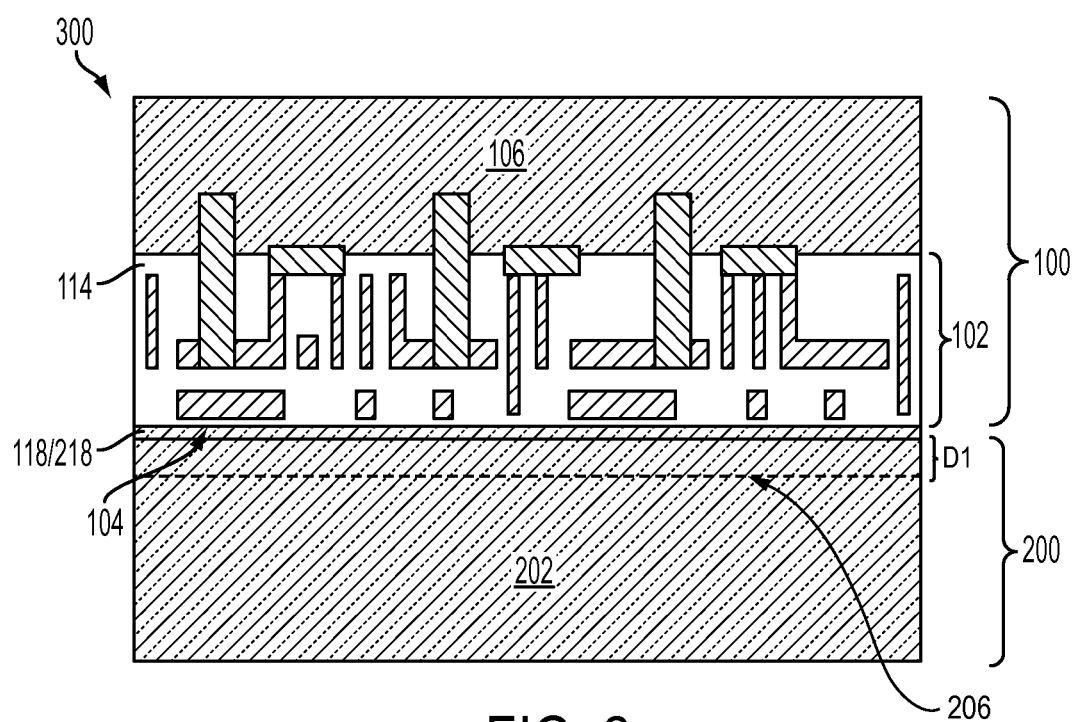
FIG. 2 is a schematic cross-sectional view of a bonded semiconductor structure that includes the processed semiconductor structure of FIG. 1 directly bonded to another semiconductor structure comprising a carrier wafer in accordance with embodiments of methods of the invention.

As shown in FIG. 2, the processed semiconductor structure 100 shown in FIG. 1 may be inverted and bonded to another semiconductor structure that, in the embodiments described with reference to FIG. 2, comprises a carrier wafer 200. A major surface of the dielectric material 114 or, if present, the bonding material 118 is in intimate contact with a major surface of the carrier wafer 200.

The carrier wafer 200 may comprise a wafer having a low bow, warp and total thickness variation, as previously described herein for the substrate 106, in order to provide sufficient uniformity and flatness for the wafer bonding process. As a non-limiting example, the carrier wafer 200 may be a high quality silicon wafer having a warp of less than about thirty micrometers (30 μm), a bow of less than about ten micrometers (10 μm) and a total thickness variation of less than about one micrometer (1 μm).

Before bringing the surfaces of the bonding material 118 of the processed semiconductor structure 100 and the carrier wafer 200 into contact, a conventional surface cleaning process may optionally be performed to remove surface debris and to form at least one hydrophilic surface. By way of example and not limitation, the exposed surfaces of the dielectric material 114 or, if present, the bonding material 118 of the processed semiconductor structure 100 and the carrier wafer 200 may be introduced to a solution that includes a mixture of water ($H_2O$), ammonium hydroxide ($NH_4OH$) and hydrogen peroxide ($H_2O_2$) at a ratio of about 5:1:1, respectively, to clean and impart hydrophilicity to the exposed surfaces of the dielectric material 114 or, if present, the bonding material 118 of the processed semiconductor structure 100 and the carrier wafer 200.

A conventional cleaning sequence known in the art as an "RCA clean" may also, optionally, be performed on at least one of the surfaces of the dielectric material 114 or, if present, the bonding material 118 of the processed semiconductor structure 100 and the carrier wafer 200 to remove organic contaminants, ionic contaminants and metallic contaminants that may interfere with bonding of the surfaces. The surfaces of the dielectric material 114 or, if present, the bonding material 118 of the processed semiconductor structure 100 and the carrier wafer 200 may be rinsed repeatedly in deionized (DI) water prior to bonding to prevent surface particles and to maintain hydrophilicity. The dielectric material 114 or, if present, the bonding material 118 of the processed semiconductor structure 100 may be bonded to the carrier wafer 200 to form a bonded semiconductor structure 300 using techniques such as thermal bonding, thermal compression bonding or thermal ultrasonic bonding.

In some embodiments, the processed semiconductor structure 100 may be directly bonded to the carrier wafer 200 without using any intermediate adhesive material therebetween. The nature of the atomic or molecular bonds between the processed semiconductor structure 100 and the carrier wafer 200 will depend upon the material compositions of each of the processed semiconductor structure 100 and the carrier wafer 200. Thus, in accordance with some embodiments, direct atomic or molecular bonds may be provided between, for example, at least one of silicon oxide and silicon nitride, and at least one of silicon, silicon oxide, and silicon nitride.

Figure 3:
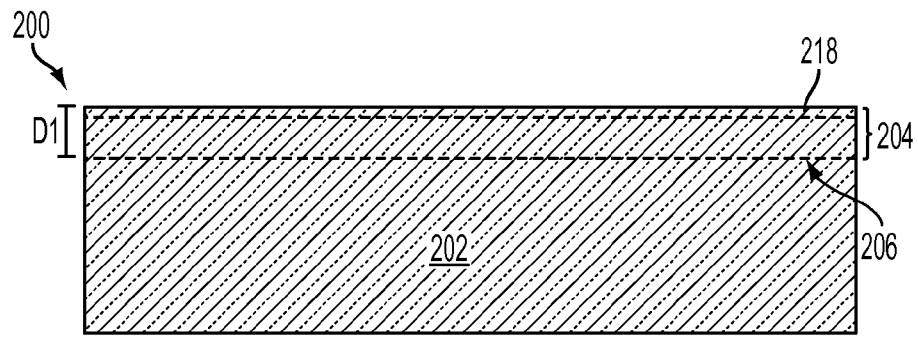
FIG. 3 is a schematic cross-sectional view of the carrier wafer shown in FIG. 2 before bonding to the processed semiconductor structure.

Referring to FIG. 3, before bonding the processed semiconductor structure 100 to the carrier wafer 200 as shown in FIG. 2, the carrier wafer 200 may be fabricated to include a semiconductor material 202 having a transfer region 204 therein, the transfer region 204 defined by an implanted zone 206, which is represented by broken lines. The transfer region 204 may be formed by implanting ionic species into the semiconductor material 202 of the carrier wafer 200 to form the implanted zone 206. For example, the ionic species may be hydrogen ions, inert gas ions or fluorine ions. The ionic species may be implanted into the carrier wafer 200 to form the implanted zone 206 along a region of the carrier wafer 200 having a peak concentration of the ions. Ion implantation may form a weakened zone within the carrier wafer 200 along which carrier wafer 200 may be susceptible to breaking or splitting when subjected to elevated temperatures or upon application of a mechanical force, such as a shear force, to the carrier wafer 200. The ion implantation parameters may be adjusted to prevent the carrier wafer 200 from splitting or breaking along the implanted zone 206 during bonding of the processed semiconductor structure 100 to the carrier wafer 200 (FIG. 2). This enables the carrier wafer 202 to be divided into two separate portions during later stages of processing, as will be described.

As a non-limiting example, the ionic species may comprise one or more of hydrogen ions, helium ions and boron ions. The one or more ionic species may be implanted at a dose of between about $1 \times 10^{16}$ ions/cm$^2$ and $2 \times 10^{17}$ ions/cm$^2$, or between $1 \times 10^{16}$ ions/cm$^2$ and $1 \times 10^{17}$ ions/cm$^2$. The one or more ionic species may be implanted at an energy of between about ten kiloelectron volts (10 KeV) and one hundred and fifty kiloelectron volts (150 KeV). The depth at which the ions are implanted into the carrier wafer 200 to form the implanted zone 206 is at least partially a function of the energy with which the ions are implanted into the carrier wafer 200. Thus, the implanted zone 206 may be formed at a desired depth in the carrier wafer 200 by selectively controlling the energy of the implanted ions. A depth D1 of the implanted zone 206 within the carrier wafer 200 may correspond to a desired thickness and/or volume of a layer of the semiconductor material 202 that may be subsequently transferred to the processed semiconductor structure 100, as described in further detail below. As a non-limiting example, the atomic species may be implanted into the carrier wafer 200 with an energy selected to form the implanted zone 206 at a depth D1 of between about ten nanometers (10 nm) and about one thousand nanometers (1000 nm) (i.e., about 100 Å to about 10000 Å).

Another bonding material 218 may, optionally, be formed over a major surface of the carrier wafer 200 nearest the implanted zone 206 and may also be formed over a major surface of the carrier wafer 200 prior to formation of the implanted zone 206. The bonding material 218 may be formed from a material that exhibits good molecular adhesion with the dielectric material 114 or, if present, the bonding material 118 overlying the processed semiconductor structure 100 (FIGS. 1 and 2). The bonding material 218 may be formed from one or more dielectric materials, such as silicon dioxide ($SiO_2$), silicon oxynitride ($SiO_xN_y$) and silicon nitride ($Si_3N_4$). The bonding material 218 may have a thickness of between about one hundred nanometers (100 nm) and about two micrometers (2 μm). By way of example and not limitation, the carrier wafer 200 may be formed from a silicon material and a bonding material 218 comprising silicon dioxide ($SiO_2$) may be formed on the carrier wafer 200 by performing a conventional thermal oxidation process. The bonding material 218 may also be deposited using, for example, chemical vapor deposition (CVD), physical vapor deposition (PVD), atomic layer deposition (ALD), or plasma enhanced chemical vapor deposition (PECVD).

Referring back to FIG. 2, the carrier wafer 200 may be bonded to the processed semiconductor structure 100 by abutting an exposed surface of the carrier wafer 200 (i.e., an exposed surface of the semiconductor material 202 or, if present, the bonding material 218) against an exposed surface of the processed semiconductor structure 100 (i.e., the dielectric material 114 or, if present, the bonding material 118) to form the bonded semiconductor structure 300. The carrier wafer 200 may be bonded to the processed semiconductor structure 100 at room temperature or at an elevated temperature (e.g., at least above one hundred degrees Celsius (100° C.)) and pressure for a sufficient amount of time to bond the bonding material 118 with the semiconductor material 202 or, if present, the bonding material 218. By way of non-limiting example, an annealing process may be performed by exposing the processed semiconductor structure 100 and the carrier wafer 200 to a temperature of between about one hundred degrees Celsius (100° C.) and about four hundred degrees Celsius (400° C.) for between about 30 minutes and 120 minutes to bond the carrier wafer 200 and the processed semiconductor structure 100. In some embodiments, the processed semiconductor structure 100 may be bonded to the carrier wafer 200 without using an adhesive material, which may reduce or eliminate temperature and pressure limitations on further processing acts that might otherwise result from use of such an adhesive.

Figure 4:
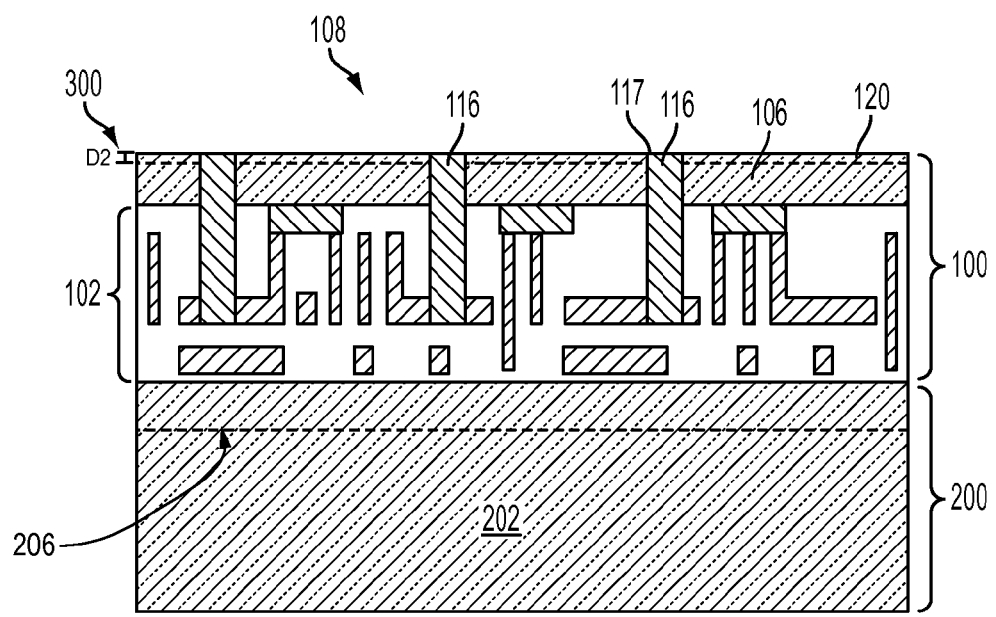
FIG. 4 is a schematic cross-sectional view of the bonded semiconductor structure of FIG. 2 after thinning the processed semiconductor structure while using the carrier wafer to handle the processed semiconductor structure.

Referring to FIG. 4, after bonding the carrier wafer 200 and the processed semiconductor structure 100 to form the bonded semiconductor structure 300, a portion of the substrate 106 may be removed from a major surface (e.g., the back surface 108) of the processed semiconductor structure 100 to expose surfaces of the through wafer interconnects 116 through the substrate 106. For example, the portion of the substrate 106 may be removed using a grinding process, a conventional chemical mechanical polishing process, an anisotropic etching process, or a combination thereof. In some embodiments, the substrate 106 may, optionally, include an etch stop material 120, such as an oxide material, which is shown in broken lines. The etch stop material 120 may be positioned vertically within the substrate 106 at various positions. For example, etch stop material 120 may be positioned within the substrate 106 or above, under or horizontal to a surface 117 of the through wafer interconnects 116.

As a non-limiting example, a grinding and chemical mechanical polishing process may be performed to remove the portion of the substrate 106 with respect to the through wafer interconnects 116 and the etch stop 120 material, if present, by fixing the carrier wafer 200, for example, on a vacuum chuck, and pressing the exposed surface of the substrate 106 against a rotating polishing pad, while a chemically and/or physically active (i.e., abrasive) slurry removes the material of the substrate 106.

As another non-limiting example, a wet etching process may be performed to remove the portion of the substrate 106 with respect to the through wafer interconnects 116 and the etch stop material 120, if present, by introducing a solution including potassium hydroxide (KOH) or tetramethylammonium hydroxide (TMAH) to the exposed surface of the substrate 106. The carrier wafer 200 is used to handle the processed semiconductor structure 100, and provides mechanical support for the processed semiconductor structure 100 during thinning of the substrate 106 to expose surfaces of the through wafer interconnects 116. The remaining portion of the substrate 106 may have a thickness D2 of from about one-half of a micrometer (0.5 μm) to about one hundred micrometers (100 μm).

Figure 5:
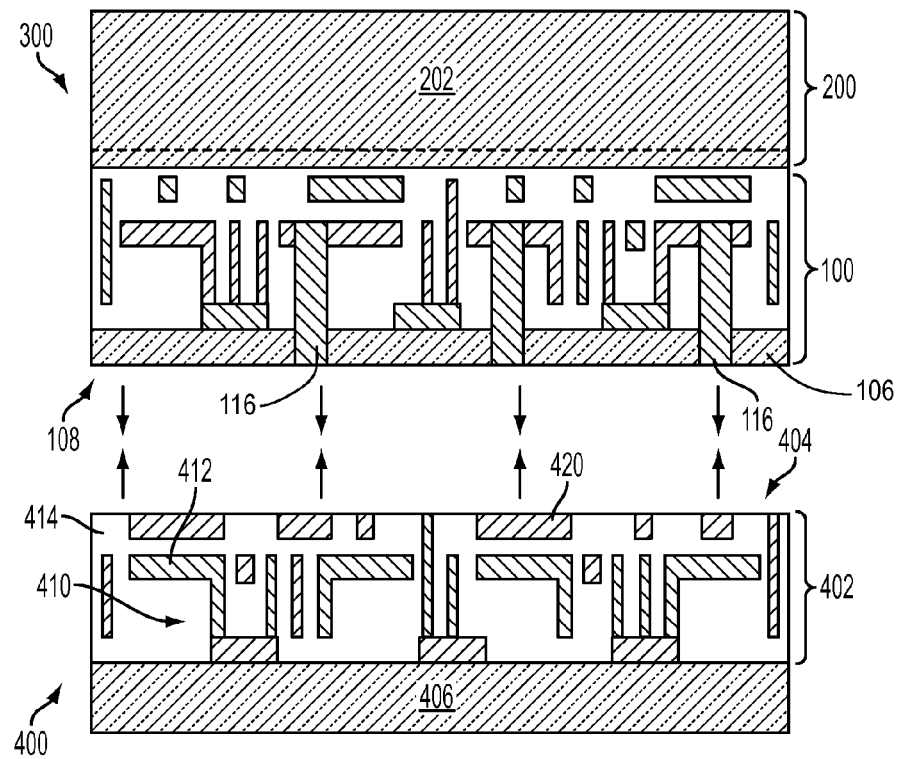
FIG. 5 is a schematic cross-sectional view of the bonded semiconductor structure shown in FIG. 4 inverted and aligned with another processed semiconductor structure to which the bonded semiconductor structure may be attached in accordance with embodiments of methods of the invention.

As shown in FIG. 5, the bonded semiconductor structure 300 may be inverted, aligned with, and brought into contact with another processed planar semiconductor structure 400, as represented by directional arrows. For example, exposed surfaces of the through wafer interconnects 116 of the bonded semiconductor structure 300 may be contacted with and bonded to exposed conductive pads 420 on an active surface 404 of the processed semiconductor structure 400.

The processed semiconductor structure 400, like the processed semiconductor structure 100, may include a device region 402 that includes device structures 410. The device region 402 may extend into substrate 406 and on and/or over a surface of a substrate 406. The substrate 406 may comprise a substrate as previously described in relation to the substrate 106 of FIG. 1. Similarly, the device structures 410 of the device region 402 may include device structures 410 as previously described in relation to the device structures 110 of FIG. 1. In some embodiments, the device region 402 of the processed semiconductor structure 400 may have at least substantially the same configuration as the device region 102 of the processed semiconductor structure 100.

After forming the device region 402 of the processed semiconductor structure 400, one or more conductive structures, such as conductive pads 420, may be formed over the device region 402. The conductive pads 420 may include one or more conductive materials, such as one or more metals (e.g., copper (Cu), aluminum (Al), tungsten (W), polycrystalline silicon and/or gold (Au)). For example, the conductive pads 420 may be formed on the processed semiconductor structure 400 in a back-end-of-line (BEOL) process. In some embodiments, the conductive pads 420 may be formed by depositing a conductive material (not shown) over a dielectric material 414 and patterning the conductive material using photolithography techniques to form the conductive pads 420. In other embodiments, the conductive pads 420 may be formed by depositing the conductive material into a plurality of openings (not shown) in the dielectric material 414, and performing a chemical mechanical polishing (CMP) process to remove portions of the conductive material overlying the openings (commonly referred to as the "Damascene Process"). The bonded semiconductor structure 300 and the processed semiconductor structure 400 may be structurally and electrically coupled with one another by aligning and bonding the through wafer interconnects 116 of the processed semiconductor structure 100 with the conductive pads 420 of the processed semiconductor structure 400.

Figure 6:
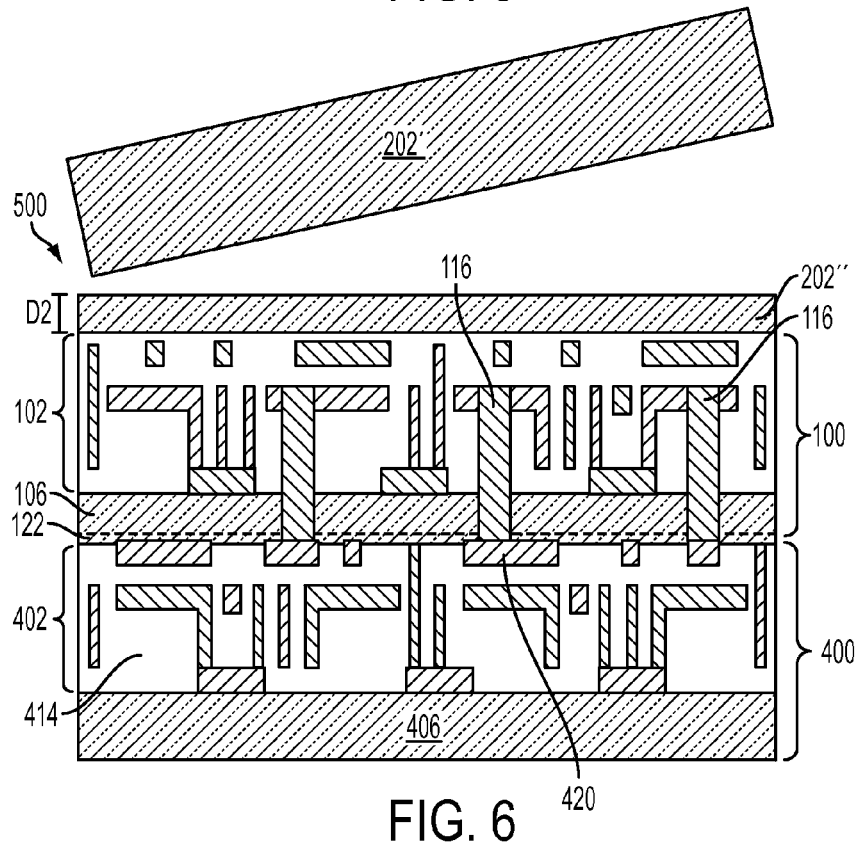
FIG. 6 is a schematic cross-sectional view of a bonded semiconductor structure that may be formed by bonding together the aligned semiconductor structures shown in FIG. 5, and further illustrates division of the carrier wafer after bonding the semiconductor structures together.

Referring to FIG. 6, the processed semiconductor structure 100 may be bonded to the processed semiconductor structure 400 to form another bonded semiconductor structure 500 in which the through wafer interconnects 116 of the processed semiconductor structure 100 are structurally and electrically coupled to the conductive pads 420 of the processed semiconductor structure 400. In some embodiments, the through wafer interconnects 116 may be directly bonded to the conductive pads 420 using a direct metal-to-metal bonding process, such as a thermo-compression bonding process, non-thermo-compression bonding or a eutectic bonding process. For example, the through wafer interconnects 116 and the conductive pads 420 may each be formed from copper, and a low temperature copper-to-copper bonding process may be performed by exposing the bonded semiconductor structure 300 (FIG. 2) and the processed semiconductor structure 400 to a temperature of between about one hundred degrees Celsius (100° C.) and about four hundred degrees Celsius (400° C.) for a sufficient amount of time for the through wafer interconnects 116 and the conductive pads 420 to bond to one another.

In other embodiments, the back surface 108 and the active surface 404 (FIG. 5) of the respective processed semiconductor structures 100 and 400 may be bonded to one another using a direct wafer bonding process, wherein the back surface 108 and active surface 404 may comprise conductive (e.g., metallic) regions and non-conductive (e.g., dielectric) regions and the direct wafer bonding process bonds metal-to-metal and dielectric-to-dielectric concurrently.

An optional bonding material may be formed over one or more of back surface 108 and active surface 404. As illustrated by a non-limiting example of FIG. 6, an optional dielectric bonding material, e.g., comprising a silicon dioxide ($SiO_2$) material 122, which is shown in broken lines, may optionally be formed over the substrate 106 using an oxide deposition process, such as, for example, a low temperature plasma deposition process. The optional silicon dioxide material 122 may further be planarized to expose conductive pads 420; such a planarization may be performed, for example, by a chemical mechanical polishing process.

The silicon dioxide material 122 may be bonded to the dielectric material 414 of the processed semiconductor structure 400 using an oxide-to-oxide bonding process such as that described with reference to FIG. 4. For example, the silicon dioxide material 122 may be bonded to the dielectric material 414 at room temperature or at an elevated temperature (e.g., at least above one hundred degrees Celsius (100° C.)). Metal-to-metal bonding processes and oxide-to-oxide bonding processes may be performed at low temperatures (i.e., temperatures of less than about four hundred degrees Celsius (400° C.) and, thus, avoid damage to the device regions 102 and 402 of the processed semiconductor structures 100 and 400. Vertically stacking the processed semiconductor structures 100 and 400 after performing the back-end-of-line (BEOL) processes according to methods of the present disclosure enables formation of conductive interconnections (e.g., coupling of through wafer interconnects 116 and conductive pads 420) between the processed semiconductor structures 100 and 400 during the bonding process.

During or upon completion of bonding of the processed semiconductor structures 100 and 400, a portion of the material 202' of the carrier wafer 200 (FIG. 5) may be separated (i.e., detached) from the bonded semiconductor structure 500 leaving a transferred layer of material 202" remaining on the processed semiconductor structure 100. Separation of the portion of material 202' of carrier wafer 200 may be performed by various chemical, thermal or mechanical processes, such as by a grinding process, an etching process, a polishing process or a lift-off process. For example, a single annealing process may be performed to bond the processed semiconductor structures 100 and 400 to one another while separating (i.e., detaching) the portion of the material 202' of the carrier wafer 200 to form the transferred layer of material 202". The annealing process may be performed by contacting a major surface of the processed semiconductor structure 100 (i.e., an exposed major surface of the substrate 106 and the exposed surfaces of the via plugs 110) with a major surface of the processed semiconductor structure 400 (i.e., an exposed major surface of the dielectric material 414 of the substrate 406 and exposed surfaces of the conductive pads 420) and annealing at a temperature of between about two hundred degrees Celsius (200° C.) and about four hundred degrees Celsius (400° C.). The annealing process may simultaneously bond the processed semiconductor structures 100 and 400 (i.e., bond the through wafer interconnects 116 to the conductive pads 420) and split the portion of the material 202' of the carrier wafer 200 from the transferred material 202".

By way of example and not limitation, the process known in the industry as the SMARTCUT® process may be used to separate or detach the portion of the material 202' from the transferred layer of material 202". Such processes are described in detail in, for example, U.S. Pat. No. RE39,484 to Bruel; U.S. Pat. No. 5,374,564 to Bruel; U.S. Pat. No. 6,303,468 to Aspar et al.; U.S. Pat. No. 6,335,258 to Aspar et al.; U.S. Pat. No. 6,756,286 to Moriceau et al.; U.S. Pat. No. 6,809,044 to Aspar et al.; and U.S. Pat. No. 6,946,365 to Aspar et al., the disclosures of each of which are incorporated herein in their entirety by this reference.

The thickness D2 of the transferred layer of material 202" may be substantially equal to the depth D1 of the implanted zone 206 within the carrier wafer 200 shown in FIGS. 2 and 3. In some embodiments, the transferred layer of material 202" may be used as a base or substrate for forming additional device structures, wherein additional device structure may be in electrical communication with device structures of processed semiconductor structure 100 and processed semiconductor structure 400. After detaching the transferred layer of material 202" from the carrier wafer 200, an exposed surface of the transferred layer of material 202" may be undesirably rough. For example, the surface of the transferred layer of material 202" may have an average roughness of between about one nanometer (1 nm) and about 20 nanometers (20 nm). The surface of the transferred layer of material 202" may be smoothed to a desired degree in order to facilitate further processing as described below, according to techniques known in the art such as, for example, one or more of a grinding process, a wet etching process and chemical mechanical polishing (CMP) process. Thus, the thickness D2 of the transferred layer of material 202" may be sufficient to enable a portion of the transferred layer of material 202" to be removed to substantially smooth a surface thereof. For example, the thickness D2 of the transferred layer of material 202" may be between about ten nanometers (10 nm) and about one thousand nanometers (1000 nm).

In other embodiments, one or more further processed semiconductor structures may be attached, e.g., via a bonding process, to bonded semiconductor structure 500, wherein the one or more further processed semiconductor structures may be formed utilizing the methods described above and may be in electrical communication with additional device structures formed in and/or over the transferred layer of material 202" and also in electrical communication with device structures 110 and 410, respectively, of processed semiconductor structure 100 and processed semiconductor structure 400.

In other embodiments, the transferred layer of material 202" may be removed from the bonded semiconductor structure 500 after processing using an anisotropic etching process, a chemical mechanical polishing (CMP) process or a combination thereof. In such an embodiment, surface roughness of the transferred layer of material 202" may not be a concern, and the transferred layer of material 202" may be formed as a very thin layer. For example, the thickness D2 of the transferred layer of material 202" may be between about ten nanometers (10 nm) and about six hundred nanometers (600 nm).

The remaining the portion of the material 202' of the carrier wafer 200 that is detached may be recycled and reused in additional processing.

The disclosed methods may be employed using known equipment and, thus, may be employed in high volume manufacturing (HVM) of semiconductor structures. Thus, the disclosed methods may enable the fabrication of electronic devices on increasingly thin semiconductor structures and enable interconnection of device structures during fabrication of three-dimensionally integrated semiconductor devices.

Embodiments of the present invention may be used in the three-dimensional integration of any type or types of semiconductor structures including die-to-die (D2D) integration, die-to-wafer (D2W), wafer-to-wafer (W2W) integration, or a combination of such integration processes.

Figure 7:
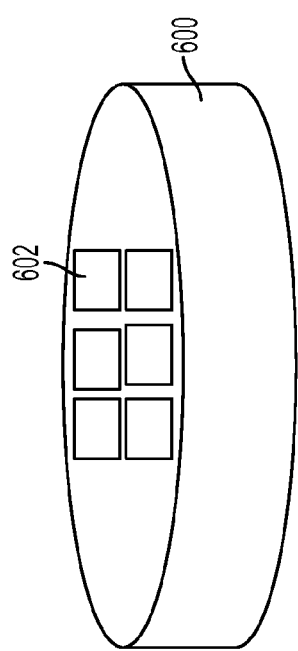
FIG. 7 is a schematic cross-sectional view of a three-dimensional semiconductor structure that may be formed in accordance with embodiments of methods of the invention.

For example, as shown in FIG. 7, a semiconductor wafer 600 that includes a plurality of individual semiconductor dice 602 may be singulated to form separate individual dice 602. The semiconductor wafer 600 may be diced using techniques such as sawing, scribing and breaking, or laser ablation. Known good dice may be identified from the plurality of semiconductor dice 602.

The known good dice identified from the plurality of semiconductor dice 602 may be separately and individually attached to carrier dice and processed (e.g., thinned) while using the carrier dice to handle the known good dice in accordance with the methods previously described herein.

Figure 8:
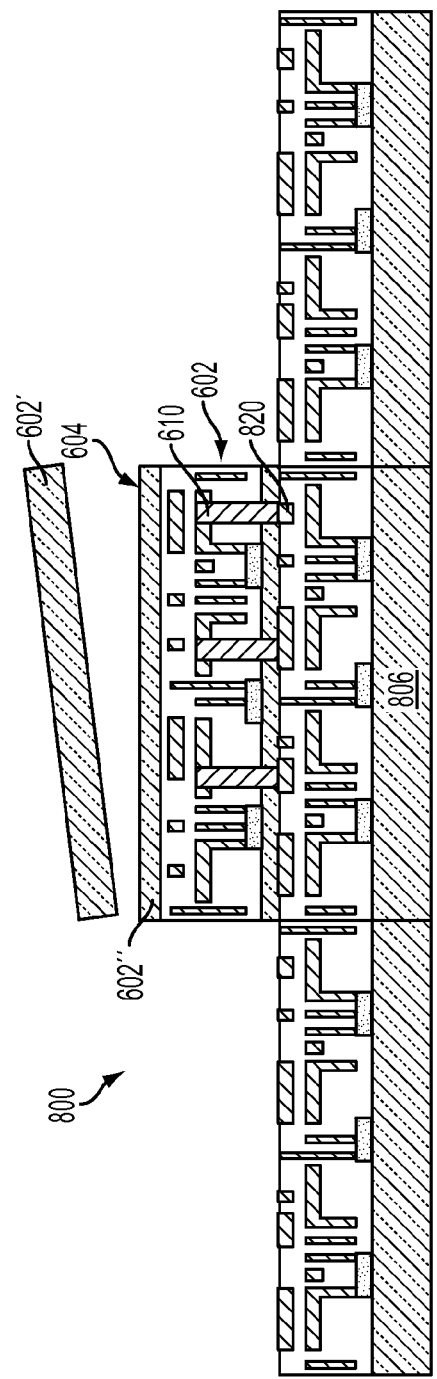
FIG. 8 is a schematic cross-sectional view of a semiconductor structure and is used to illustrate embodiments of methods of the invention that include bonding of individual semiconductor dice onto a relatively larger semiconductor wafer in a three-dimensional (3D) integration process.

Referring to FIG. 8, the known good dice then may be structurally and electrically coupled to another wafer 800 in accordance with the methods previously described herein. The wafer 800 may include a plurality of dice at least partially fabricated thereon. For example, through wafer interconnects 610 of the known good semiconductor dice 602 may be aligned and bonded with conductive pads 820 of the dice on the wafer 800. An annealing process may be performed as previously described with respect to FIG. 6 to detach a portion 602' of a carrier die along a weakened zone 604 within the carrier die, while at the same time forming a metal-to-metal bond between the through wafer interconnects 610 of the known good die 602 and the conductive pads 820 of an at least partially formed die on the wafer 800. In some embodiments, a remaining portion 602" of the carrier die may be removed using an etching process or a chemical mechanical polishing (CMP) process. In other embodiments, the remaining portion 602" of the carrier die may be used as a base layer for fabricating additional device structures. In some embodiments, a plurality of the known good dice 602 with the dice attached thereto may be structurally and electrically coupled to the wafer 800 to at least substantially reconstruct a wafer like the wafer 600 shown in FIG. 7 over the wafer 800, and the portions 602' of the carrier dice may be detached at least substantially simultaneously in a single process. Reconstruction of the wafer, like semiconductor wafer 600, may include populating the wafer with the known good dice, followed by the deposition of an oxide material and planarization to form a continuous surface with the known good dice embedded within the oxide material.

Additional examples of non-limiting embodiments of the invention are described below.

Embodiment 1: A method of fabricating a semiconductor structure, comprising: forming a first semiconductor structure including at least a portion of an integrated circuit on a first substrate; implanting ions into a carrier wafer to form a weakened region within the carrier wafer; directly bonding the carrier wafer to a first side of the first semiconductor structure; processing the first semiconductor structure while the carrier wafer is attached to the first semiconductor structure using the carrier wafer to handle the first semiconductor structure; directly bonding a second semiconductor structure including at least a portion of an integrated circuit to a second side of the first semiconductor structure opposite the first side of the semiconductor structure to which the carrier wafer is directly bonded; and separating a layer of material from the carrier wafer from a remaining portion of the carrier wafer along the weakened region therein.

Embodiment 2: The method of Embodiment 1, further comprising forming at least one through wafer interconnect (TWI) extending at least partially through the first substrate.

Embodiment 3: The method of Embodiment 1 or Embodiment 2, wherein processing the first semiconductor structure comprises removing a portion of the first substrate from the second side of the first semiconductor structure and exposing at least one conductive structure of the at least a portion of the integrated circuit of the first semiconductor structure.

Embodiment 4: The method of Embodiment 3, wherein exposing at least one conductive structure of the at least a portion of the integrated circuit of the first semiconductor structure comprises exposing a through wafer interconnect (TWI) in the first semiconductor structure.

Embodiment 5: The method of Embodiment 4, wherein directly bonding the second semiconductor structure to the second side of the first semiconductor structure comprises directly bonding the through wafer interconnect of the first semiconductor structure to at least one conductive element of the second semiconductor structure.

Embodiment 6: The method of any one of Embodiments 1 through 5, wherein directly bonding the second semiconductor structure to the second side of the first semiconductor structure comprises directly bonding metal of at least one conductive element of the first semiconductor structure to metal of at least one conductive element of the second semiconductor structure.

Embodiment 7: The method of any one of Embodiments 1 through 6, wherein directly bonding the second semiconductor structure to the second side of the first semiconductor structure comprises directly bonding at least one of a semiconductor material and an oxide material of the second semiconductor structure to at least one of a semiconductor material and an oxide material of the first semiconductor structure.

Embodiment 8: The method of any one of Embodiments 1 through 7, wherein separating the layer of material of the carrier wafer from a remaining portion of the carrier wafer along the weakened region therein comprises annealing the carrier wafer at a temperature of at least 100° C. and detaching a portion of the carrier wafer overlying the weakened region from another portion of the carrier wafer remaining attached to the first semiconductor structure.

Embodiment 9: The method of any one of Embodiments 1 through 8, wherein separating the layer of material from the carrier wafer along the weakened region comprises leaving a layer of material of the carrier substrate having a thickness of between about 10 nm and about 1000 nm attached to the first semiconductor structure.

Embodiment 10: The method of any one of Embodiments 1 through 9, wherein the direct bonding of the second semiconductor structure to the second side of the first semiconductor structure results in the separating of the layer of material from the carrier wafer along the weakened region therein.

Embodiment 11: The method of Embodiment 10, wherein the direct bonding of the carrier wafer to the first side of the first semiconductor structure comprises weakening the carrier wafer along the weakened region therein without dividing the carrier wafer along the weakened region therein.

Embodiment 12: A method of fabricating a semiconductor structure, comprising: implanting ions into a first semiconductor structure and forming a weakened region therein; directly bonding a surface of the first semiconductor structure to a surface of a second semiconductor structure to form a bonded semiconductor structure including the first semiconductor structure and the second semiconductor structure; handling the bonded semiconductor structure using the first semiconductor structure while removing a portion of the second semiconductor structure and exposing at least one conductive structure extending at least partially through the second semiconductor structure; aligning the at least one conductive structure exposed through the second semiconductor structure with at least one conductive structure of a third semiconductor structure; heating the bonded semiconductor structure and the third semiconductor structure; directly bonding the at least one conductive structure exposed through the second semiconductor structure to the at least one conductive structure of the third semiconductor structure responsive to heating the bonded semiconductor structure and the third semiconductor structure; and dividing the first semiconductor structure along the weakened region responsive to heating the bonded semiconductor structure and the third semiconductor structure and leaving a portion of the first semiconductor structure on the second semiconductor structure.

Embodiment 13: The method of Embodiment 12, further comprising forming the at least one conductive structure exposed through the second semiconductor structure to comprise a through wafer interconnect (TWI).

Embodiment 14: The method of Embodiment 12 or Embodiment 13, wherein implanting ions into the first semiconductor structure comprises exposing a surface of the semiconductor wafer to the ions at a dose of between $1 \times 10^{16}$ ions/cm$^2$ and $2 \times 10^{17}$ ions/cm$^2$ and an energy of between 10 KeV and 150 KeV.

Embodiment 15: The method of any one of Embodiments 12 through 14, wherein implanting ions into the first semiconductor structure comprises implanting the ions into a carrier wafer and forming a weakened region within the carrier wafer at a depth of between about 10 nm and about 1000 nm from a flat major surface of the carrier wafer.

Embodiment 16: The method of any one of Embodiments 12 through 15, wherein directly bonding the surface of the first semiconductor structure to the surface of the second semiconductor structure to form the bonded semiconductor structure comprises bonding a surface of a silicon carrier wafer to a surface of a silicon or a silicon dioxide material of the second semiconductor structure.

Embodiment 17: The method of any one of Embodiments 12 through 16, wherein directly bonding the surface of the first semiconductor structure to the surface of the second semiconductor structure to form the bonded semiconductor structure comprises bonding a surface of a silicon dioxide material on a silicon carrier wafer to a surface of a silicon or a silicon dioxide material of the second semiconductor structure.

Embodiment 18: The method of any one of Embodiments 12 through 17, wherein aligning the at least one conductive structure exposed through the second semiconductor structure with at least one conductive structure of a third semiconductor structure comprises aligning at least one copper through wafer interconnect (TWI) exposed through the second semiconductor structure with at least one copper bond pad of the third semiconductor structure.

Embodiment 19: The method of Embodiment 18, wherein heating the bonded semiconductor structure and the third semiconductor structure comprises heating the bonded semiconductor structure and the third semiconductor structure to a temperature of between about 100° C. and about 400° C.

Embodiment 20: The method of any one of Embodiments 12 through 19, further comprising processing the portion of the first semiconductor structure on the second semiconductor structure after dividing the first semiconductor structure along the weakened region and forming at least one device structure on or in the portion of the first semiconductor structure on the second semiconductor structure.

Embodiment 21: The method of any one of Embodiments 12 through 19, further comprising removing the portion of the first semiconductor structure from the second semiconductor structure after dividing the first semiconductor structure along the weakened region.

Embodiment 22: A bonded semiconductor structure, comprising: a plurality of bonded processed semiconductor structures; and a carrier die or wafer bonded to at least one processed semiconductor structure of the plurality of bonded processed semiconductor structures, the carrier die or wafer having a weakened zone comprising a plurality of implanted ions therein at an average depth of between 10 nm and 1000 nm from a surface of the carrier die or wafer bonded to the at least one processed semiconductor structure of the plurality of bonded processed semiconductor structures.

Embodiment 23: The bonded semiconductor structure of Embodiment 22, wherein the plurality of bonded processed semiconductor structures are structurally and electrically coupled together at least partially by through wafer interconnects.

Embodiment 24: The bonded semiconductor structure of Embodiment 22 or 23, wherein the plurality of bonded processed semiconductor structures are directly bonded together without using an adhesive material therebetween.

Embodiment 25: The bonded semiconductor structure of any one of Embodiments 22 through 24, wherein the carrier die or wafer is directly bonded to the at least one processed semiconductor structure of the plurality of bonded processed semiconductor structures.

While embodiments of the present invention have been described herein using certain examples, those of ordinary skill in the art will recognize and appreciate that the invention is not limited to the particulars of the example embodiments. Rather, many additions, deletions and modifications to the example embodiments may be made without departing from the scope of the invention as hereinafter claimed. For example, features from one embodiment may be combined with features of other embodiments while still being encompassed within the scope of the invention as contemplated by the inventors.

What is claimed is:

1. A semiconductor structure, comprising:
   at least one bonded semiconductor structure including two or more processed semiconductor structures that are attached together; and
   a temporary carrier die or wafer bonded to one processed semiconductor structure of the at least one bonded semiconductor structure, the temporary carrier die or wafer having a weakened zone comprising a plurality of implanted ions therein at an average depth of between 10 nm and 1000 nm from a surface of the temporary carrier die or wafer bonded to the one processed semiconductor structure of the at least one bonded semiconductor structure.

2. The semiconductor structure of claim 1, wherein the two or more processed semiconductor structures are structurally and electrically coupled together at least partially by through wafer interconnects.

3. The semiconductor structure of claim 1, wherein the two or more processed semiconductor structures are directly bonded together without using an adhesive material therebetween.

4. The semiconductor structure of claim 3, wherein the temporary carrier die or wafer is directly bonded to the at least one bonded semiconductor structure.

5. The semiconductor structure of claim 1, wherein the temporary carrier die or wafer is directly bonded to the at least one bonded semiconductor structure.

6. The semiconductor structure of claim 5, wherein at least one of the two or more processed semiconductor structures comprises a substrate and a device region on the substrate, the device region including a plurality of device structures.

7. The semiconductor structure of claim 6, wherein the substrate has a warp of less than about thirty micrometers (30 µm), a bow of less than about ten micrometers (10 µm), and a total thickness variation of less than about one micrometer (1 µm).

8. The semiconductor structure of claim 6, wherein the plurality of device structures includes a plurality of through wafer interconnects extending through the device region and at least partially through the substrate.

9. The semiconductor structure of claim 8, wherein at least one of the through wafer interconnects is exposed at a back surface of the substrate.

10. The semiconductor structure of claim 5, further comprising a bonding material between the temporary carrier die or wafer and the at least one bonded semiconductor structure.

11. The semiconductor structure of claim 10, wherein the bonding material comprises at least one of an oxide, a nitride, and an oxynitride.

12. The semiconductor structure of claim 11, wherein the temporary carrier die or wafer comprises a silicon die or wafer.

13. The semiconductor structure of claim 1, wherein the two or more processed semiconductor structures include a stack of processed semiconductor structures, each processed semiconductor structure comprising a die or wafer including at least a portion of an integrated circuit.

14. The semiconductor structure of claim 13, wherein the processed semiconductor structures of the stack are bonded together using metal-to-metal bonds between active conductive features of the processed semiconductor structures.

15. The semiconductor structure of claim 13, wherein the stack of processed semiconductor structures comprises at least one semiconductor die.

16. The semiconductor structure of claim 15, wherein the stack of processed semiconductor structures comprises at least one semiconductor wafer.

17. The semiconductor structure of claim 15, wherein the temporary carrier die or wafer is a temporary carrier die.

18. The semiconductor structure of claim 15, wherein the temporary carrier die or wafer is a temporary carrier wafer.

19. The semiconductor structure of claim 13, wherein the stack of processed semiconductor structures comprises at least one semiconductor wafer.

20. The semiconductor structure of claim 19, wherein the temporary carrier die or wafer is a temporary carrier wafer.

* * * * *